United States Patent [19]

Kawahata et al.

[11] Patent Number: 4,837,458
[45] Date of Patent: Jun. 6, 1989

[54] FLIP-FLOP CIRCUIT

[75] Inventors: Sigeyuki Kawahata; Yoshitaka Sugawara, both of Hitachi, Japan

[73] Assignee: Hitachi, Ltd., Tokyo, Japan

[21] Appl. No.: 86,823

[22] Filed: Aug. 19, 1987

[30] Foreign Application Priority Data

Aug. 22, 1986 [JP] Japan ................... 61-195415
Oct. 31, 1986 [JP] Japan ................... 61-258274

[51] Int. Cl.⁴ .................. H03K 3/26; H03K 17/16; H03K 19/094
[52] U.S. Cl. ...................... 307/279; 307/443; 307/451; 307/637; 331/144; 361/58
[58] Field of Search ............... 307/443, 448, 451, 530, 307/200 A, 200 B, 631, 637, 640, 279, 296.3; 331/143–144; 361/51

[56] References Cited

U.S. PATENT DOCUMENTS 4,484,088 11/1984 Mazin et al. ............ 307/279
4,695,744 9/1987 Giordana ............... 307/279

FOREIGN PATENT DOCUMENTS 2319246 2/1976 France .
0117912 10/1985 Japan .

OTHER PUBLICATIONS

IBM Tech Disc. Bul. 307/296.3 Repchick.
Nikkei Electronics 1987, No. 413.

Primary Examiner—J. Zazworsky
Assistant Examiner—Margaret R. Wanbach
Attorney, Agent, or Firm—Antonelli, Terry & Wands

[57] ABSTRACT

A flip-flop circuit which requires only a small drive power and which operates with small power consumption, and in which the on-off transition occurs reliably. The flip-flop circuit comprises MOS field effect transistors (abbreviated as MOSFET's) and resistors. A first MOSFET and a second MOSFET, to which control signals are applied, are commonly-connected at their sources to be connected at the sources to a voltage source supplying a power supply voltage sufficiently higher than a threshold voltage of a third MOSFET and a fourth MOSFET interconnected to each other. The interconnected third and fourth MOSFET's are connected at their gates to the drains of the first and second MOSFET's, respectively, and to the drains of the fourth and third MOSFET's through resistors, respectively. The third and fourth MOSFET's are common-connected at their sources. An output terminal is led out from the drains of the first and third MOSFET's.

13 Claims, 3 Drawing Sheets

FLIP-FLOP CIRCUIT

BACKGROUND OF THE INVENTION

This invention relates generally to flip-flop circuits, and more particularly to a flip-flop circuit which comprises a plurality of MOS field effect transistors (abbreviated hereinafter as MOSFET's) and resistors and which is featured by a small drive power requirement, small power consumption and reliable transition between an on state and an off state.

Prior art flip-flop circuits and typically composed of, for example, bipolar transistors and resistors or MOSFET's and resistors as described at pages 134 to 135 of a book entitled "Shusekikairo no Kaiseki to Sekkei" (Analysis and Design of Integrated Circuits) published on Apr. 1, 1969 by Kindai Kagakusha Publishing Company in Japan. Such flip-flop circuits are widely used for memories and logic elements of modern electronic circuits and for driving switching elements of modern electronic circuits.

FIG. 1 shows a basic form of a prior art, flip-flop circuit composed of bipolar transistors and resistors. A flip-flop circuit can be formed by an interconnection of a pair of logic circuits, and in the structure shown in FIG. 1, a first bipolar transistor 20 and a second bipolar transistor 21 are interconnected. The interconnected first and second transistors 20 and 21 cannot simultaneously take their on or off state. When the first transistor 20 is in its on state, an "L" level appears at a first output terminal $O_1$, while an "H" level appears at a second output terminal $O_2$. When a pulse signal is applied to a second input terminal $IN_2$ in the above state of the circuit, the collector-emitter voltage of a fourth transistor 22 decreases to turn off the first transistor 20, and the second transistor 21 is turned on in turn. Accordingly, an "H" level appears at the first output terminal $O_1$, while an "L" level appears at the second output terminal $O_2$. An inverse operation to that described above occurs when a pulse signal is then applied to a first input terminal $IN_1$. Thus, the states of the output terminals $O_1$ and $O_2$ can be inverted by application of a pulse signal to the input terminal $IN_1$ or $IN_2$. However, the prior art flip-flop circuit shown in FIG. 1 has the following problems:

(1) The power consumption of the flip-flop circuit itself is large due to a continuous flow of current through either the transistor 20 or 21.
(2) Large drive power is required since bipolar transistors are used to form the flip-flop circuit.
(3) The signal—receiving transistor 19 or 22 requires large drive power in order to cause the transition of one of the interconnected transistors 20 and 21 from its on state to its off state.

In FIG. 1, reference numerals 23 and 24 designate resistors for connecting the transistors 20 and 21 to power supply terminals $V_1$ and $V_2$ respectively.

SUMMARY OF THE INVENTION

It is a primary object of the present invention to provide a flip-flop circuit which requires small drive power and operates with small power consumption, and in which the transition between an on state and an off state occurs reliably.

The flip-flop circuit of the present invention which attains the above object comprises a plurality of MOSFET's and resistors.

A first MOSFET and a second MOSFET, to which control signals are applied, are commonly-connected at their sources to be connected at the sources to a voltage source supplying a power supply voltage sufficiently higher than a threshold voltage of a third MOSFET and a fourth MOSFET interconnected to each other. The interconnected third and fourth MOSFET's are connected at their gates to the drains of the second and first MOSFET's respectively and to the drains of the fourth and third MOSFET's through resistors respectively. The third and fourth MOSFET's are common-connected at their sources. An output terminal is led out from the drains of the first and second MOSFET's.

Control signals of opposite polarities are applied to the gates of the first and second MOSFET's respectively. That is, an on signal and an off signal are applied to the gates of these transistors respectively. When, for example, the on signal is applied to the gate of the second MOSFET, this second MOSFET is turned on. Accordingly, the power supply voltage is applied to the gate of the third MOSFET connected to the drain of the conducting second MOSFET, and the third MOSFET is turned on. The drain potential of the first MOSFET to which the off signal is applied, and the gate potential of the fourth MOSFET connected to the drain of the first MOSFET, become equal to the source potential of the fourth MOSFET through the resistor and through the third MOSFET turned on in response to the application of the power supply voltage. Therefore, the fourth MOSFET having its gate connected to the drain of the first MOSFET to which the off signal is applied is turned off, because the source potential is now equal to the gate potential. Assume that the control signals of opposite polarities are applied to this drive circuit when the circuit is in such a steady state. In such a transient state, the first and third MOSFET's are temporarily turned on. The power supply voltage is divided by the ON-state resistances of the MOSFET's placed in the transient state, and a large current may flow. This divided voltage is applied to the gate of the fourth MOSFET connected to the drain of the first MOSFET. The voltage division ratio is preferably selected to be as high as possible so that a high voltage can be applied to the gate of the fourth MOSFET thereby reliably inverting the state of the flip-flop circuit. Therefore, the resistors act to apply a highest possible voltage to the gates of the third and fourth MOSFET's and act also as means for protecting the MOSFET's against the flow of an overcurrent when, for example, the first and third MOSFET's are temporarily simultaneously turned on.

The first and second MOSFET's provided for the purpose of receiving the control signals must be of a p-channel (n-channel) MOS type when the interconnected third and four MOSFET's are of an n-channel (p-channel) MOS type.

The present invention was disclosed by one of the inventors of the present invention in IDEM 86 (1986 International Electron Devices Meeting) pp. 226-229, December 1986 and "NIKKEI ELECTRONICS" pp. 97-98, published on Jan. 26, 1987 is based on the IDEM 86.

Other features of the present invention will become apparent from the following detailed description taken in conjunction with the accompanying drawings.

DESCRIPTION OF THE PREFERRED EMBODIMENTS

Preferred embodiments of the flip-flop circuit of the present invention when used as a gate circuit of semiconductor switching element having a MOS gate will now be described.

EMBODIMENT 1

Figure 1:
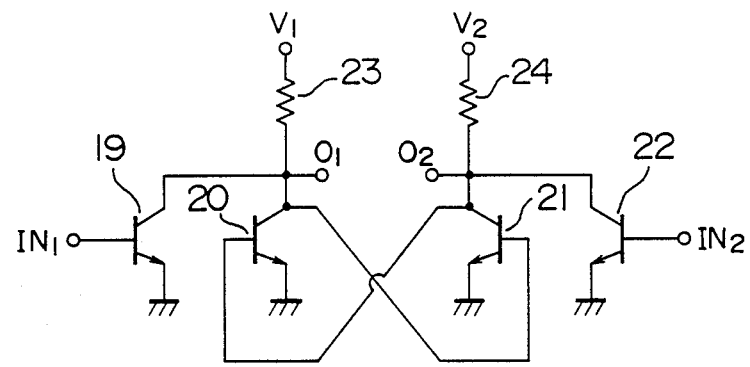
FIG. 1 is a circuit diagram of a prior art flip-flop circuit.
Figure 2:
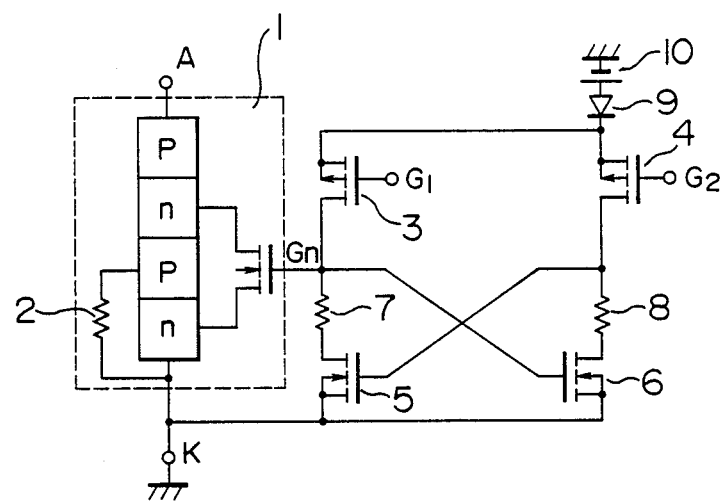
FIG. 2 is a circuit diagram of an electronic device using an embodiment of the flip-flop circuit of the present invention.

FIG. 2 is a circuit diagram of an embodiment of the flip-flop circuit of the present invention when used as a gate circuit of a semiconductor switching element having a MOS gate. In FIG. 2, reference numeral 1 designates a MOS gate type main drive part which is herein illustrated as a MOS gate thyristor having an n-channel gate $G_n$. Reference numerals 2, 7 and 8 are resistors; 3, 4, 5 and 6 are MOSFET's; 9 is a reverse bias blocking diode; and 10 is a d.c. power source. Symbols A and K designate the anode and the cathode respectively of the MOS gate thyristor 1. Symbols $G_1$ and $G_2$ designate control signal input gates. The operating principle and features of the first embodiment of the flip-flop circuit according to the present invention will be described with reference to FIG. 2.

The MOSFET 3 is in its off state when a gate voltage higher than the power supply voltage of the d.c. power source 10 is applied to the gate $G_1$. The MOSFET 4 is in its on state when a control signal of zero volt is applied to the gate $G_2$. The power supply voltage of the d.c. power source 10 is applied to the gate of the MOSFET 5, and the MOSFET 5 is in its on state. Accordingly, the potential of the gate of the MOSFET 6 and the potential of the n-channel gate $G_n$ of the MOS gate thyristor 1 are equal to the potential of the cathode K of the MOS gate thyristor 1. At this time, the MOSFET 6 is in its off state, and the MOS gate thyristor 1 is in its blocking state. Suppose, in such a situation, that a control signal of zero volt is applied to the gate $G_1$, and a gate voltage higher than the power supply voltage of the power source 10 is applied to the gate $G_2$. The MOSFET 4 starts to make transition from its on state to its off state, and the MOSET 3 starts to make transition from its off state to its on state. Since the MOSFET 4 is in a transient state, the voltage tending to maintain the MOSFET 5 in its on state is still applied to the gate of the MOSFET 5. Accordingly, the MOSFET's 3 and 5 are in their on state, and current starts to flow through the route of the power source 10→diode 9→MOSFET 3→resistor 7→MOSFET 5. The power supply voltage is divided by the diode 9, ON-state resistance of the MOSFET 3, resistor 7 and ON-state resistance of the MOSFET 5, and such a divided voltage is applied to the n-channel gate $G_n$ of the MOS gate thyristor 1 and the gate of the MOSFET 6. The MOSFET 6 starts to conduct when the voltage applied to the gate of the MOSFET 6 is higher than the threshold voltage of the MOSFET 6. Gate charges of the MOSFET 5 flow out through the resistor 8 and MOSFET 6, and the MOSFET 5 starts to make transition from its on state to its off state. Accordingly, the on resistance of the MOSFET 5 increases to increase the divided voltage applied to the gate of the MOSFET 6 and the n-channel gate $G_n$ of the MOS gate thyristor 1. Thus, the MOSFET's 5 and 6 work upon each other in such a manner as to turn on the latter from its off state and to turn off the former from its on state. The value of the voltage applied to the gate of the MOSFET 6 and the n-channel gate $G_n$ of the MOS gate thyristor 1 is dependent upon the voltage division ratio determined by the values of the resistances including the ON-state resistances of the MOSFET's 3 and 5. This voltage division ratio is preferably selected to be as large as possible so as to apply a highest possible voltage to the gate of the MOSFET 6 and the n-channel gate $G_n$ of the MOS gate thyristor 1. In other words, the resistors 7 and 8 inserted in the circuit can be regarded to increase the ON-state resistances of the MOSFET's 5 and 6 respectively. Thus, a large voltage division ratio can be provided.

According to the illustrated embodiment of the present invention, a gate voltage high enough for turning on the MOS gate thyristor 1 can be reliably supplied. Also, a stable withstand voltage capability can be ensured because the cathode potential and the gate potential of the MOS gate thyristor 1 are maintained to be equal to each other when the MOS gate thyristor 1 is in its blocking state. Further, no appreciable current flows in the steady operation mode of the MOS gate thyristor 1. Even in a transient state, the current value can be decreased by making the gate signal rise and fall quickly and selecting the resistance values of the resistors 7 and 8 to be as large as about several hundred kilo-ohms.

The operation of the circuit becomes unstable when the resistors 7 and 8 are not provided in the circuit. The following conditions must be satisfied in order that the circuit can stably operate:

$r_4 << R_8 + r_6$
$r_3 << R_7 + r_5$ where $r_3$: ON-state resistance of MOSFET 3
$r_4$: ON-state resistance of MOSFET 4
$r_5$: ON-state resistance of MOSFET 5
$r_6$: ON-state resistance of MOSFET 6
$R_7$: resistance value of resistor 7
$R_8$: resistance value of resistor 8

The case where the resistors 7 and 8 were not provided in the circuit was compared with the case where the resistors 7 and 8 each having a resistance value of 200 kΩ were provided in the circuit. In the former case, a large voltage fluctuation of several tens of volts in the cathode potential of the MOS gate thyristor resulted in an unstable circuit operation. In contrast, in the latter case, the circuit could operate reliably regardless of a cathode potential fluctuation of 250 volts.

Thus, the presence of the resistors 7 and 8 in the circuit provides the following advantages:

(1) The circuit can stably operate even during reversal of the control signals applied to the circuit.
(2) The circuit can be protected against an overcurrent.

In the circuit shown in FIG. 2, the input and the main drive part (the output) are coupled through the MOS gate which inhibits flow of current into each other. Thus, the drive power requirement is small, and the input is electrically isolated from the main drive part (the output). Since the input is electrically isolated from the main drive part (the output), there is no leakage of current from the input to the output and from the output to the input. Therefore, the circuit shown in FIG. 2 can be effectively used in, for example, a field handling a very small signal and a field requiring detection of such a signal with high accuracy. Further, by increasing the isolation voltage (or dielectric strength) to, for example, about 1,000 volts, the circuit shown in FIG. 2 may replace a prior art photo coupler or a prior art electromagnetic relay.

EMBODIMENT 2

Figure 3:
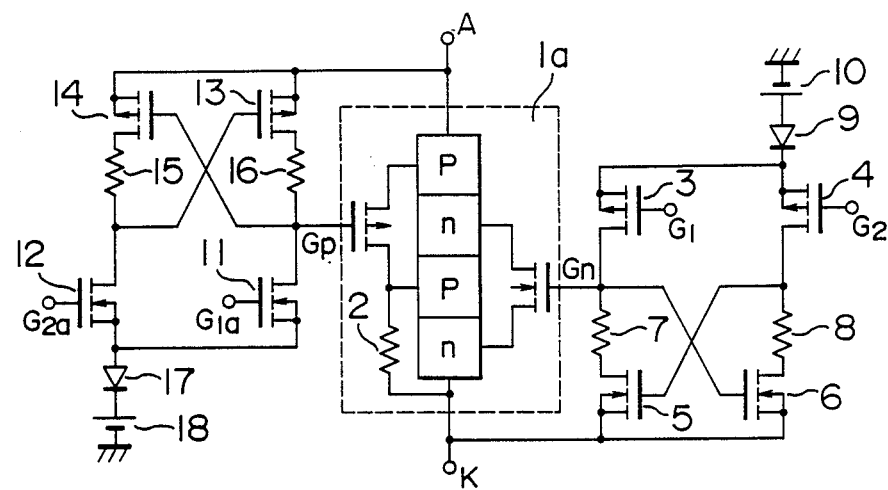
FIG. 3 is a circuit diagram of an electronic device using another embodiment of the flip-flop circuit of the present invention.

FIG. 3 is a circuit diagram showing a second embodiment of the present invention. In FIG. 3, like reference numerals are used to designate like parts appearing in FIG. 2. A main drive part 1a is a complementary gated MOS thyristor (abbreviated hereinafter as a COGMOS thyristor) turned on by gate signals applied to an n-channel gate $G_n$ and a p-channel gate $G_p$. This COGMOS thyristor is described in detail in, for example, JP-A-61-61521. Reference numerals 11, 12, 13 an 14 designate MOSFET's; 15 and 16 are resistors; 17 is a reverse bias blocking diode; and 18 is a d.c. power source. Symbols $G_{1a}$ and $G_{2a}$ designate control signal input gates.

Parts associated with the n-channel gate $G_n$ of the COGMOS thyristor 1a are the same as those provided in the first embodiment shown in FIG. 2. Parts associated with the p-channel gate $G_p$ of the COGMOS thyristor 1a are such that the cathode K, n-channel MOSFET's and p-channel MOSFET's in the first embodiment are changed to the anode A, p-channel MOSFET's and n-channel MOSFET's respectively. The operation of this second embodiment is similar to that of the first embodiment.

It is supposed herein that the potential of the cathode K of the COGMOS thyristor 1a is not fixed relative to the reference potential of the gate drive circuit. That is, it is supposed that the potential $V_k$ of the cathode K of the COGMOS thyristor 1a is in a floating condition. First, when the potential $V_k$ of the cathode K of the COGMOS thyristor 1a is lower than the reference potential of the gate drive circuit, control signals are applied to the gates $G_1$ and $G_2$ so as to turn on the MOSFET's 3, 6 and to turn off the MOSFET's 4, 5. A voltage difference equal to the sum of the power supply voltage of the power source 10 and the potential $V_k$ of the cathode K of the COGMOS thyristor 1a appears across the n-channel gate $G_n$ and the cathode K of the COGMOS thyristor 1a thereby turning on the COGMOS thyristor 1a. On the other hand, when the potential $V_k$ of the cathode K of the COGMOS thyristor 1a is higher than the reference potential of the drive circuit, the p-channel gate $G_p$ is used. Control signals are applied to the gates $G_{1a}$ and $G_{2a}$ to turn on the MOSFET's 11, 14 and to turn off the MCSFET's 12, 13. A voltage difference equal to the sum of the power supply voltage of the power source 18 and the potential $V_A$ of the anode A of the COGMOS thyristor 1a appears across the p-channel gate $G_p$ and the anode A of the COGMOS thyristor 1a thereby turning on the COGMOS thyristor 1a. Thus, in the second embodiment of the present invention, the COGMOS thyristor 1a can be turned on regardless of the difference between the potential $V_k$ of its cathode K and the reference potential of the drive circuit.

In order to drive the COGMOS thyristor 1a, a voltage higher than the threshold voltage must be applied across the cathode K and the n-channel gate $G_n$ (or across the anode A and the p-channel gate $G_p$). For the purpose of merely driving the COGMOS thyristor 1a, various circuits can be used. However, the second embodiment of the flip-flop circuit according to the present invention is most suitable for satisfying the following conditions:
(1) The COGMOS thyristor can be driven without fixing the potential of its cathode (or its anode) at the ground potential (that is, in a floating condition).
(2) The input and the output can be electrically isolated from each other. (That is, no leakage current flows between the input and the output.)
(3) The circuit can be integrated on a single chip.

In the first and second embodiments described above, the output terminal of the flip-flop circuit is led out from the drain side of the MOSFET's to which the control signals are applied. When the MOS gate thyristor 1 or the COGMOS thyristor 1a is drive by such a flip-flop circuit, the thyristor can be quickly turned on due to the large voltage drop across the resistor 7 even when the MOSFET 5 may not be completely turned off.

EMBODIMENT 3

Figure 4:
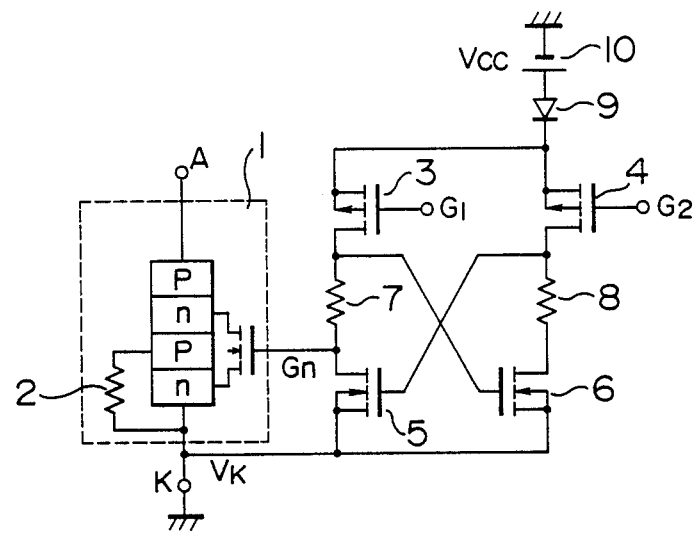
FIG. 4 is a circuit diagram of an electronic device using still another embodiment of the flip-flop circuit of the present invention.

FIG. 4 is a circuit diagram showing a third embodiment of the present invention. In FIG. 4 in which like reference numerals are used to designate like parts appearing in FIG. 2, the reference numeral 1 designates a MOS gate type main drive part which is herein a MOS gate thyristor having an n-channel gate $G_n$. Reference numerals 2, 7 and 8 are resistors; 3, 4, 5 and 6 are MOSFET's; 9 is a reverse bias blocking diode; and 10 is a d.c. power source. Symbols A and K designate the anode and the cathode respectively of the MOS gate thyristor 1. Symbols $G_1$ and $G_2$ designate control signal input gates. The operating principle and features of the third embodiment will be described with reference to FIGS. 4 and 5.

The MOSFET 3 is in its off state when a gate voltage higher than the power supply voltage of the d.c. power source 10 is applied to the gate $G_1$. The MOSFET 4 is in its on state when a control signal of zero volt is applied to the gate $G_2$. The power supply voltage of the d.c. power source 10 is applied to the gate of the MOSFET 5, and the MOSFET 5 is in its on state. Accordingly, the potential of the gate of the MOSFET 6 and the potential of the n-channel gate $G_n$ of the MOS gate thyristor 1 are equal to the potential of the cathode K of the MOS gate thyristor 1. At this time, the MOSFET 6 is in its off state, and the MOS gate thyristor 1 is in its blocking state. Suppose, in such a situation, that a control signal of zero volt is applied to the gate $G_1$, and a voltage higher than the power supply voltage of the power source 10 is applied to the gate $G_2$. The MOSFET 4 starts to make transition from its on state to its off state, and the MOSFET 3 starts to make transition from its off state to its on state. Since the MOSFET 4 is in a transient state, the voltage tending to maintain the MOSFET 5 in its on state is still applied to the gate of the MOSFET 5. Accordingly, the MOSFET's 3 and 5 are in their on state, and current starts to flow through the route of the power source 10→diode 9→MOSFET 3→resistor 7→MOSFET 5. The power supply voltage is divided by the diode 9, ON-state resistance of the MOSFET 3, resistance of the resistor 7 and ON-state resistance of the MOSFET 5, and such a divided voltage is applied to the n-channel gate $G_n$ of the MOS gate thyristor 1 and the gate of the MOSFET 6. The MOSFET 6 starts to conduct when the voltage applied to the gate of the MOSFET 6 is higher than the threshold voltage of the MOSFET 6. Gate charges of the MOSFET 5 flow out through the resistor 8 and MOSFET 6, and the MOSFET 5 starts to make transition from its on state to its off state. Accordingly, the ON-state resistance of the MOSFET 5 increases to increase the divided voltage applied to the gate of the MOSFET 6 and the gate $G_n$ of the MOS gate thyristor 1. Thus, the MOSFET's 5 and 6 work upon each other in such a way as to turn on the latter from its off state and to turn off the former from its on state. The value of the voltage applied to the gate of the MOSFET 6 and the n-channel gate $G_n$ of the MOS gate thyristor 1 is dependent upon the voltage division ratio determined by the values of the resistances including the ON-state resistances of the MOSFET's 3 and 5. This voltage division ratio is preferably selected to be as large as possible so as to apply a highest possible voltage to the gate of the MOSFET 6 and the n-channel gate $G_n$ of the MOS gate thyristor 1. In other words, the resistors 7 and 8 inserted in the circuit can be regarded as operating to increase the ON-state resistances of the MOSFET's 5 and 6 respectively. Thus, a large voltage division ratio can be provided.

Figure 5:
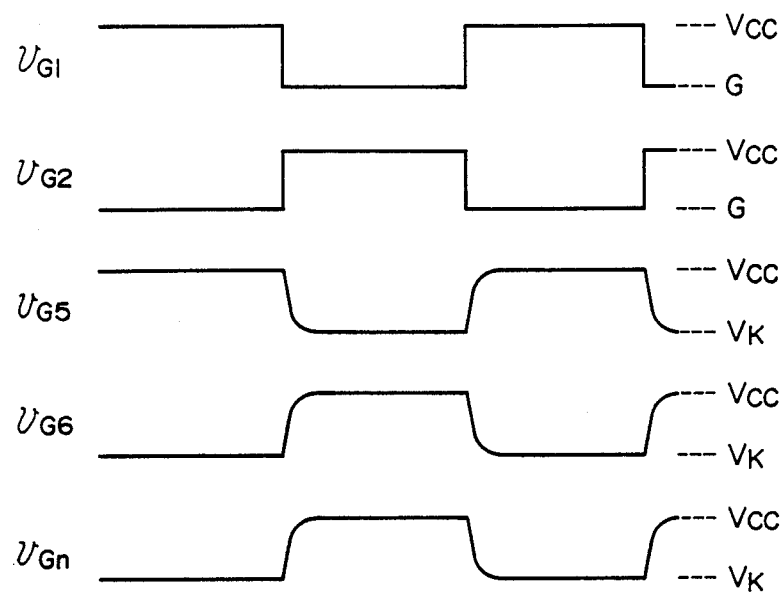
FIG. 5 is a time chart illustrating the operation of the circuit shown in FIG. 4.

FIG. 5 is a time chart illustrating the operation of the circuit shown in FIG. 4. In FIG. 5, symbols $V_{G1}$, $V_{G2}$, $V_{G5}$, $V_{G6}$, $V_{Gn}$, $V_{cc}$, G and $V_k$ designate the gate input signal of MOSFET 3, the gate input signal of the MOSFET 4, the gate voltage of the MOSFET 5, the gate voltage of the MOSFET 6, the output voltage of the flip-flop circuit, the power supply voltage of the power source 10, the ground potential, and the cathode potential of the MOS gate thyristor 1, respectively.

According to this third embodiment, a gate voltage high enough for turning on the MOS gate thyristor 1 can be reliably supplied. When the MOS gate thyristor 1 is in its blocking state, the output impedance is kept low by the function of the interconnected MOSFET's 5 and 6, and its gate potential is maintained equal to its cathode potential. Therefore, even when a steep voltage is applied across the anode A and the cathode K of the MOS gate thyristor 1, charge-up of the n-channel gate $G_n$ can be prevented, so that the dV/dt capability can be improved and a stable withstand voltage capability can be ensured. Further, no appreciable current flows in the steady operation mode of the MOS gate thyristor 1. Even in a transient state, the current value can be decreased by making the gate signal to rise and fall quickly and selecting the resistance values of the resistors 7 and 8 to be as large as about several hundred kilo-ohms. In the circuit shown in FIG. 4, the input and the main drive part (the output) are coupled through the MOS gate which inhibits flow of current into each other. Thus, the drive power requirement is small, and the input and the output are electrically isolated from each other.

EMBODIMENT 4

Figure 6:
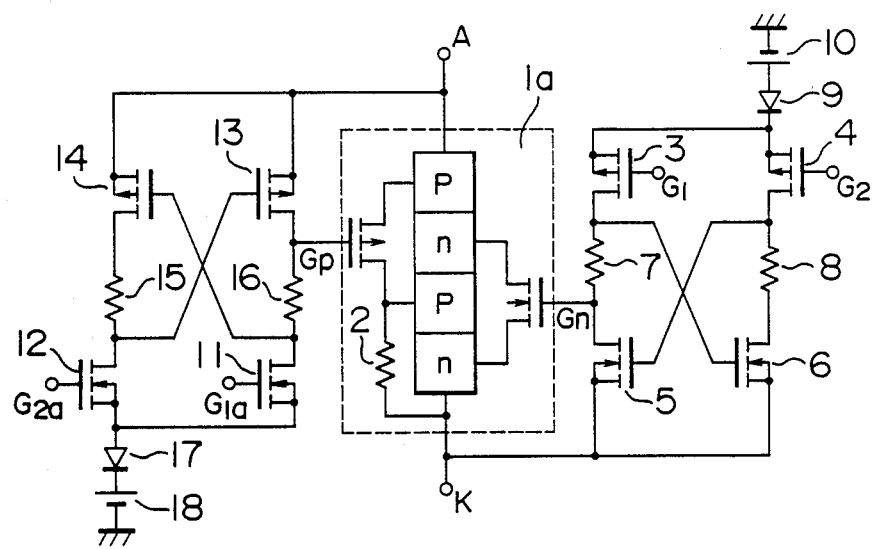
FIG. 6 is a circuit diagram of an electronic device using yet another embodiment of the flip-flop circuit of the present invention.

FIG. 6 is a circuit diagram showing a fourth embodiment of the present invention. In FIG. 6, like reference numerals are used to designate like parts appearing in FIG. 4. A main drive part 1a is a COGMOS thyristor turned on by gate signals applied to an n-channel gate $G_n$ and a p-channel gate $G_p$. Reference numerals 11, 12, 13 and 14 designate MOSFET's; 15 and 16 are resistors; 17 is a reverse blocking diode; and 18 is a d.c. power source. Symbols $G_{1a}$ and $G_{2a}$ designate control signal input gates.

Parts associated with the n-channel gate $G_n$ of the COGMOS thyristor 1a are the same as those provided in the third embodiment shown in FIG. 4. Parts associated with the p-channel gate $G_p$ of the COGMOS thyristor 1a are such that the cathode K, n-channel MOSFET's and p-channel MOSFET's in the third embodiment are changed to the anode A, p-channel MOSFET's and n-channel MOSFET's respectively. The operation of this fourth embodiment is similar to that of the third embodiment.

It is supposed herein that the potential of the cathode K of the COGMOS thyristor 1a is not fixed relative to the reference potential of the gate drive circuit. That is, it is supposed that the potential $V_k$ of the cathode K of the COGMOS thyristor 1a is in a floating condition. First, when the potential $V_k$ of the cathode K of the COGMOS thyristor 1a is lower than the reference potential of the gate drive circuit, control signals are applied to the gates $G_1$ and $G_2$ so as to turn on the MOSFET's 3, 6 and to turn off the MOSFET's 4, 5. A voltage difference equal to the sum of the power supply voltage of the power source 10 and the potential $V_k$ of the cathode K of the COGMOS thyristor 1a appears across the n-channel gate $G_n$ and the cathode K of the COGMOS thyristor 1a thereby turning on the COGMOS thyristor 1a. On the other hand, when the potential $V_k$ of the cathode K of the COGMOS thyristor 1a is higher than the reference potential of the drive circuit, the p-channel gate $G_p$ is used. Control signals are applied to the gates $G_{1a}$ and $G_{2a}$ to turn on the MOSFET's 11, 14 and to turn off the MOSFET's 12, 13. A voltage difference equal to the sum of the power supply voltage of the power source 18 and the potential $V_A$ of the anode A of the COGMOS thyristor 1a appears across the p-channel gate $G_p$ and the anode A of the COGMOS thyristor 1a thereby turning on the COGMOS thyristor 1a. Thus, in the fourth embodiment of the present invention, the COGMOS thyristor 1a can be turned on regardless of the difference between the potential $V_k$ of its cathode K and the reference potential of the drive circuit.

In the third and fourth embodiments described above, the output terminal of the flip-flop circuit is led out from the drain side of the interconnected MOSFET's, and the output impedance of the interconnected MOSFET's provides the output impedance of the flip-flop circuit. Thus, the output impedance is small and large when the MOSFET connected to the output terminal is turned on and off respectively.

In the third and fourth embodiments in which the output terminal of the flip-flop circuit is led out from the drain side of the interconnected MOSFET's 5 and 6, the n-channel gate $G_n$ of the MOS thyristor 1 (1a) is connected to the cathode K by the ON-state resistance of the MOSFET 5 only. Therefore, even when noise may be applied in the voltage blocking mode, charge-up of the n-channel gate $G_n$ of the MOS thyristor 1 (1a) can be minimized to ensure a large noise margin.

The circuit associated with the p-channel gate $G_p$ in the second and fourth embodiments will now be discussed. When the potential of the cathode K of the MOS thyristor 1 (1a) is lower than the power supply voltage of the power source 10, the MOS thyristor 1 (1a) can be driven by the circuit associated with the n-channel gate $G_n$. However, when the potential of the cathode K is higher than the power supply voltage of the power source 10, the MOS thyristor 1 (1a) cannot be driven by the circuit associated with the n-channel gate $G_n$. In such a case, the MOS thyristor 1a can be driven by applying a negative voltage to the p-channel gate $G_p$. That is, even when the potential of the cathode K of the MOS thyristor (the COGMOS thyristor) 1a is indefinite (that is, floating), the MOS thyristor 1a can be reliably driven by either the drive circuit associated with the n-channel gate $G_n$ or that associated with the p-channel gate $G_p$.

The diode 9 or 17 shown in FIGS. 2, 3, 4 and 6 is provided for the purpose of preventing leakage of current when the MOS thyristor 1 or 1a is placed in a floating condition and the circuit is reverse biased. When, for example, the potential of the cathode K is higher than the power supply voltage of the power source 10 (or when the potential of the anode A is lower than the power supply voltage of the power source 18), current tends to flow from the cathode K (or the anode A) to the ground through the circuit. The diode 9 or 17 prevents such current flow. The MOS thyristor is forward biased when the potential of the anode A is higher than that of the cathode K under a condition similar to that described above with regard to the diode 9 or 17. In this case, the drive circuit associated with the n-channel gate $G_n$ is reverse biased, and the MOS thyristor cannot be driven from the side of the n-channel gate $G_n$. In such a case, the MOS thyristor can be driven by applying a negative voltage to the p-channel gate $G_p$ from the anode A.

The MOS gate thyristor referred to in the embodiments described above is one of various types of thyristors. The MOS gate thyristor has a multilayer or pnpn structure and can be regarded as an element of a composite structure consisting of a pnp transistor and an npn transistor. The individual transistors act to amplify each other and may be turned on in response to a very small signal. That is, the individual transistors tend to maloperate in response to noise. To avoid such a maloperation, the p-type base and the n-type emitter of the npn transistor are connected by $R_{GK}$ (the resistor 2 in FIGS. 2, 3, 4 and 6), so as to decrease the virtual $h_{FE}$ and to ensure a sufficient noise margin.

As a modification, the resistors 7, 8, 15 and 16 in FIGS. 2, 3, 4 and 6 may be replaced by depletion type MOSFET's.

In lieu of the MOS gate thyristor used as a main drive part in FIGS. 2, 3, 4 and 6, a MOS gate type element such as a FET or an IGBT requiring small drive power may be used.

It will be understood from the foregoing detailed description that the present invention provides a flip-flop circuit comprising signal-receiving MOSFET's, interconnected MOSFET's, and resistors connected to the interconnected MOSFET's. The flip-flop circuit according to the present invention provides the following advantages:

(1) The power consumption of the circuit is small.
(2) The drive power requirement is small.
(3) The circuit has a function of overcurrent protection.
(4) On-off transition occurs reliably.

We claim:

1. A flip-flop circuit comprising:
   a first field effect transistor of a first conductivity type to the gate of which an input signal of a first polarity is applied;
   a second field effect transistor of a first conductivity type to the gate of which an input signal of a second polarity opposite to said first polarity is applied;
   a third and a fourth field effect transistor both of a second conductivity type having their sources electrically connected with each other,
   said first and said second field effect transistor having their sources commonly connected,
   said third and said fourth field effect transistor having their gates connected with a drain of said second and of said first field effect transistor, respectively,
   an output terminal provided on a connection between the gate of said fourth field effect transistor and a drain of said third field effect transistor,
   a first resistor along said connection between the gate of said fourth field effect transistor and the drain of said third field effect transistor; and
   a second resistor connected between the gate of said third field effect transistor and a drain of said fourth field effect transistor.

2. A flip-flop circuit according to claim 1, wherein said first resistor is connected between the gate of the fourth effect transistor and the output terminal.

3. A flip-flop circuit according to claim 1, wherein said first resistor is connected between the output terminal and the drain of the third field effect transistor.

4. A flip-flop circuit according to claim 2, wherein said first and second field effect transistors are connected at their sources to a d.c. power source through a diode.

5. A flip-flop circuit according to claim 4, wherein said output terminal is connected to a p-channel gate of a MOS gate thyristor, and said third and fourth field effect transistors are electrically connected at their sources to the cathode of said MOS gate thyristor.

6. A flip-flop circuit according to claim 5, wherein a resistor is connected across a p-type base and an n-type emitter of said MOS gate thyristor.

7. A flip-flop circuit according to claim 1, wherein said first and second field effect transistors are of a p-channel MOS type, and said third and fourth field effect transistors are of an n-channel MOS type.

8. A flip-flop circuit according to claim 2, wherein said first and second field effect transistors are connected at their sources to a d.c. power source through a diode.

9. A flip-flop circuit according to claim 8, wherein said output terminal is connected to a p-channel gate of a MOS gate thyristor, and said third and fourth field effect transistors are electrically connected at their sources to the cathode of said MOS gate thyristor.

10. A flip-flop circuit according to claim 9, wherein a resistor is connected across a p-type base and an n-type emitter of said MOS gate thyristor.

11. A flip-flop circuit according to claim 1, wherein said first and second field effect transistors are of an n-channel MOS type, and said third and fourth field effect transistors are of a p-channel MOS type.

12. A flip-flop circuit according to claim 11, wherein said first and second field effect transistors are connected at their sources to a d.c. power source through a diode.

13. A flip-flop circuit according to claim 12, wherein said output terminal is connected to an n-channel gate of a MOS gate thyristor, and said third and fourth field effect transistors are electrically connected at their sources to the anode of said MOS gate thyristor.

* * * * *